United States Patent
Fang et al.

(10) Patent No.: US 7,314,543 B2
(45) Date of Patent: Jan. 1, 2008

(54) TIN DEPOSITION

(75) Inventors: Ming Fang, Portland, OR (US); Valery M. Dubin, Portland, OR (US); Scott M. Haight, Portland, OR (US)

(73) Assignee: Intel Corporation, Santa Clara, CA (US)

(*) Notice: Subject to any disclaimer, the term of this patent is extended or adjusted under 35 U.S.C. 154(b) by 757 days.

(21) Appl. No.: 10/685,659

(22) Filed: Oct. 14, 2003

(65) Prior Publication Data

US 2005/0077082 A1   Apr. 14, 2005

(51) Int. Cl.
*C25D 5/02* (2006.01)
*C25D 7/12* (2006.01)
*C25D 3/30* (2006.01)
*C25D 3/32* (2006.01)

(52) U.S. Cl. ............... 205/302; 205/300; 205/123; 205/157

(58) Field of Classification Search ........ 205/300, 205/302, 123, 157, 758; 438/758
See application file for complete search history.

(56) References Cited

U.S. PATENT DOCUMENTS

| | | | | |
|---|---|---|---|---|
| 4,820,388 A * | 4/1989 | Kurze et al. | ............ | 205/239 |
| 5,174,887 A | 12/1992 | Federman et al. | ............ | 205/253 |
| 5,492,863 A | 2/1996 | Higgins, III | ............ | 437/183 |
| 5,698,087 A | 12/1997 | Bokisa | ............ | 205/254 |
| 5,750,017 A | 5/1998 | Zhang | ............ | 205/102 |
| 6,322,686 B1 * | 11/2001 | Brown et al. | ............ | 205/253 |
| 6,342,148 B1 | 1/2002 | Chiu et al. | ............ | 205/302 |
| 6,982,191 B2 * | 1/2006 | Larson | ............ | 438/118 |

* cited by examiner

*Primary Examiner*—Edna Wong
(74) *Attorney, Agent, or Firm*—Fish & Richardson P.C.

(57) ABSTRACT

A device includes an integrated circuit and a deposited tin in electrical contact with a portion of the integrated circuit. The deposited tin is formed by electrodeposition from a bath. The deposited tin includes a residue characteristic of the bath. The bath includes a bath-soluble tin compound, a strong acid, and a sulfopropylated anionic surfactant. In another aspect, a composition includes between approximately 20 and 40 grams per liter of one of stannous methane sulfonate, stannous sulfate, and a mixture thereof, between approximately 100 and 200 grams per liter of one of methanesulfonic acid, sulfuric acid, and a mixture thereof, and between approximately 1 and 2 grams per liter of one or more polyethyleneglycol alkyl-3-sulfopropyl diethers. In another aspect, a method includes electroplating tin with a current density of greater than approximately 30 mA/cm2 and a plating efficiency of greater than approximately 95%.

12 Claims, 1 Drawing Sheet

TIN DEPOSITION

BACKGROUND

This disclosure relates to tin deposition, for example, by electroplating.

Systems and techniques for depositing tin can be used in various industries to form a wide array of commercial products. For example, tin can be electroplated onto steel strips to form tinplate.

DESCRIPTION OF DRAWINGS

Like reference symbols in the various drawings indicate like elements.

DETAILED DESCRIPTION

Figure 1:
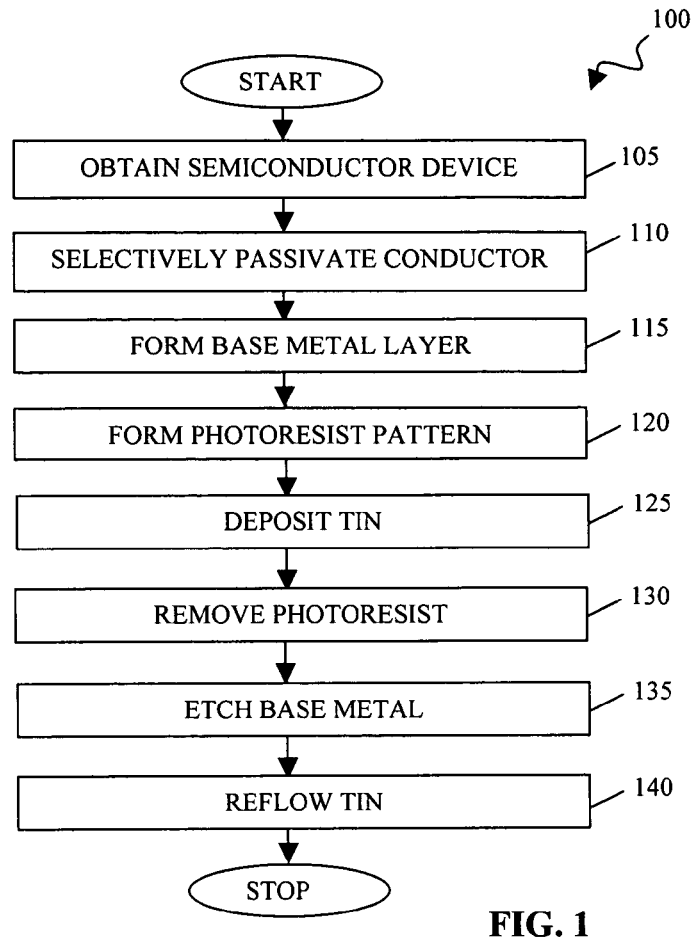
FIG. 1 is a flowchart of a process for plating tin onto a semiconductor device.

FIG. 1 is a flowchart of a process 100 for plating tin onto a semiconductor device. The actor performing process 100 obtains a semiconductor device that has been metallized or otherwise includes a conductive or semiconductive portion at 105. For example, the semiconductor device can include a titanium, chromium, or aluminum film that has been deposited by physical vapor deposition (PVD) to form under bump metal pads on a semiconductor die. The semiconductor die can include a microprocessor.

If necessary, the conductive or semiconductive portion of the device can be selectively passivated at 110. For example, a non-conducting passivation layer such as a silicon oxide, a silicon nitride, or a polyimide can be formed above selected locations on the conductive or semiconductive portion while leaving other locations exposed. These exposed locations can be the site of pad openings where tin bumps are to be formed. The tin bumps can be used to connect a semiconductor die to packaging in Flip Chip packaging processes.

Depending on the nature of the conductive or semiconductive portion of the device, a base metal layer can be formed at 115. The base metal layer can act as a barrier that prevents or reduces diffusion into the conductive or semiconductive portion of the device through the exposed locations. The base metal layer can be a 200-400 nm thick PVD titanium/nickel vanadium.

A photoresist pattern with openings above some or all of the exposed locations can be formed at 120. For example, polyimide can be spun coat atop the device and openings can be formed in the film using lithographic techniques. The openings can be the site of pad openings where tin bumps are to be formed.

Tin can be deposited over the openings in the photoresist layer of the semiconductor device at 125. For example, tin bumps can be electroplated onto a barrier metal layer. Tin can be electroplated using the systems and techniques discussed below.

The photoresist layer obtained at 120 can be removed at 130 and any excess portion of the base metal layer formed at 115 can be etched away at 135. The tin deposited above the openings can be reflowed at 140, for example, by heating the tin deposit to temperatures between 200 and 300° C.

The deposition of tin can include pretreatment of the deposition substrate. For example a metal substrate can be pretreated by exposing the substrate to a strong acid such as methane sulfonic acid. Voltage cycling can also be used during pretreatment.

Tin can be deposited by electroplating. The electroplating bath can be an aqueous solution that includes a bath-soluble tin compound, an acid, and a surfactant. The electroplating solution can also include a grain refiner.

The bath soluble tin compound can be a stannic or stannous salt. The stannic or stannous salt can be a sulfate, an alkane sulfonate, or an alkanol sulfonate. For example, the bath soluble tin compound can be one or more stannous alkane sulfonates of the formula:

(RSO$_3$)$_2$Sn where R is an alkyl group that includes from one to twelve carbon atoms. The stannous alkane sulfonate can be stannous methane sulfonate with the formula:

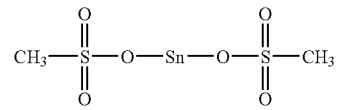

The bath soluble tin compound can also be stannous sulfate of the formula:

SnSO$_4$

The electroplating bath can include between approximately 20 and 40 grams per liter of one of stannous methane sulfonate, stannous sulfate, and a mixture of stannous methane sulfonate and stannous sulfate.

An acid included in the electroplating solution can be a strong acid. A strong acid is an acid that dissociates almost completely in the electroplating solution. The strong acid can be a sulfuric acid, an alkane sulfonic acid, or an alkanol sulfonic acid. For example, the strong acid can be one or more alkane sulfonic acids of the following formula:

RSO$_3$H where R is an alkyl group that includes from one to twelve carbon atoms. Alkane sulfonic acids include, for example, methane sulfonic acid, ethane sulfonic acid, propane sulfonic acid, 2-propane sulfonic acid, butane sulfonic acid, 2-butane sulfonic acid, pentane sulfonic acid, hexane sulfonic acid, decane sulfonic acid, and dodecane sulfonic acid.

The strong acid can be sulfuric acid or a mixture of sulfuric acid with one or more alkane sulfonic acids.

An anion of the bath soluble tin salt can correspond to an anion of the strong acid. The electroplating bath can include between approximately 100 and 200 grams per liter, for example, 130 to 170 grams per liter, of one of methanesulfonic acid, sulfuric acid, and a mixture of methanesulfonic acid and sulfuric acid.

A surfactant included in the electroplating solution can be an anionic surfactant. The anionic surfactant can be a sulfopropylated compound. The sulfopropylated compound can include a water soluble hydrophilic portion. The hydrophilic portion can be polymeric, such as a polyethylene glycol, a polypropylene glycol, a poly(ethylene-propylene) glycol, a poly(hydroxyethyl methacrylate), a poly(dimethyl acrylamide), a poly(acrylic acid), a poly(methacrylic acid), a polysulfone, poly(vinyl alcohol), a polyacrylamide, a poly(acrylamide-acrylic acid), a poly(styrene sulfonate), a poly(ethylene oxide), a poly(ethylene oxide-propylene oxide), a poly(glycolic acid), a poly(lactic acid), a poly (vinylpyrrolidone), a cellulosic, a polysaccharide, a mixture thereof, and a copolymer thereof.

Example anionic sulfonate surfactants that include a polymeric hydrophilic portion are one or more polyethyleneglycol alkyl-3-sulfopropyl diethers of the formula:

$R(OCH_2CH_2)_nO(CH_2)_3SO_3X$ where R is an n-alkyl and X is a cationic species in aqueous solution. For example, X can be potassium, R can be include between 13 and 15 carbon atoms, and n can be between 5 and 12.

Example formulae of polyethyleneglycol alkyl-3-sulfopropyl diethers include buten-2-one is also known as benzalacetone or benzylideneacetone and has the formula:

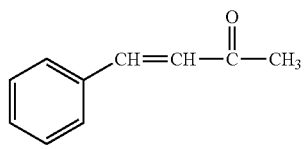

The electroplating bath can include between approximately 10 and 30 ppm of benzalacetone.

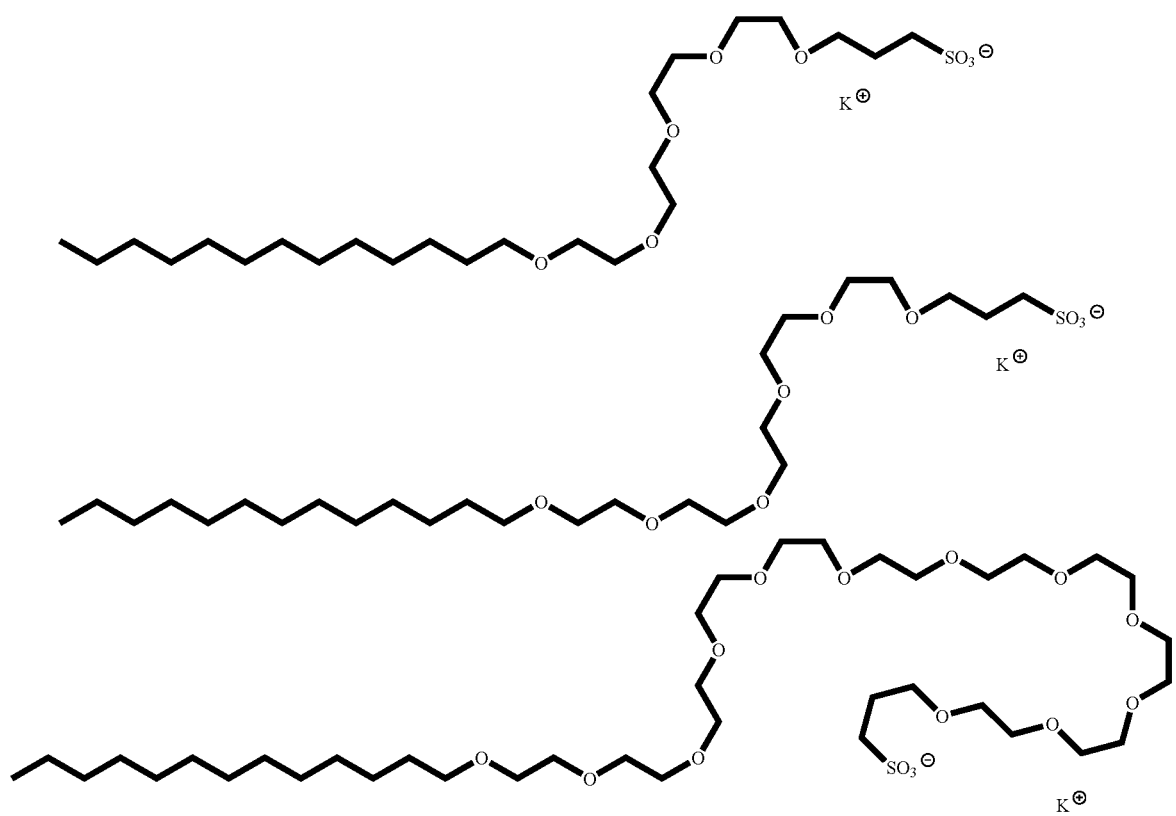

Polyethyleneglycol alkyl-3-sulfopropyl diethers are available from RASCHIG GmbH, Ludwigshafen, Germany under the trade names RALUFON F 11-13, RALUFON F 4-I, RALUFON F 5-13, and RALUFON F 7-13. The electroplating bath can include between approximately 1 and 2 grams of a potassium salt of one or more polyethyleneglycol alkyl-3-sulfopropyl diethers per liter.

A grain refiner included in the electroplating solution can be a compound effective to restrict grain growth during electrodeposition. A grain refiner can restrict grain growth by adsorbing to grain boundaries during plating. By restricting grain growth, a grain refiner can provide electroplated tin with relatively uniform grain sizes and low porosities. The grain refiner can be an organic compound. A grain refiner can include a system of conjugated pi bonds, such as an aromatic ring. Examples of grain refiners that includes a system of conjugated pi bonds include one or more of hydroquinone and 4-phenyl-3-buten-2-one. 4-Phenyl-3-

Tin electroplating can be performed at relatively high speed. For example, current densities greater than approximately 30 mA/cm$^2$, greater than approximately 40 mA/cm$^2$, and greater than approximately 50 mA/cm$^2$ can be used while achieving high plating efficiencies. For example, when using an aqueous plating bath that includes: between approximately 20 and 40 grams per liter of one of stannous methane sulfonate, stannous sulfate, and a mixture thereof; between approximately 100 and 200 grams per liter, for example, 130 to 170 grams per liter, of one of methanesulfonic acid, sulfuric acid, and a mixture thereof; and between approximately 1 and 2 grams of a potassium salt of one or more polyethyleneglycol alkyl-3-sulfopropyl diethers per liter, plating efficiencies in excess of approximately 95% can be achieved with these current densities.

Figure 2:
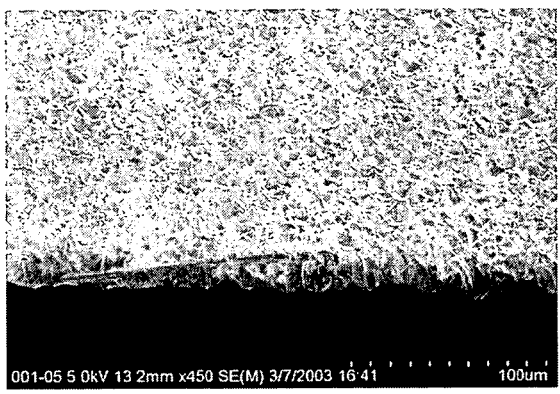
FIG. 2 is an SEM image of the center of a tin deposit.
Figure 3:
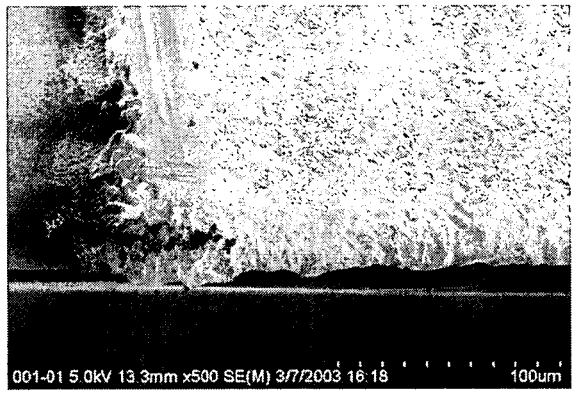
FIG. 3 is an SEM image of the edge of the tin deposit of FIG. 2.

FIGS. 2 and 3 show scanning electron microscopy (SEM) images of tin deposits that were beaker scale electroplated under the following conditions:
current density: 60 mA/cm$^2$;

agitation: moderate;
temperature: ambient;
cathode: 2 cm² blanket wafer with copper seed layer;
anode: 6 cm² tin metal sheet;
plating pretreatment: 1 minute immersion in 10% methane sulfonic acid followed by a deionized water rinse; and
plating time: 5 minutes.

The plating efficiency was approximately 99%. FIG. 2 shows the morphology of the center of the deposit. FIG. 3 shows the morphology of the edge of the deposit. No whisker issue was observed after six months of ambient storage.

The approaches to electroplating described herein can be used to generate tin films that are substantially lead-free. For example, the films can be greater than approximately 99% tin.

The approaches to electroplating described herein can yield tin films that include organic residue characteristic of the plating baths.

A number of embodiments of the invention have been described. Nevertheless, it will be understood that various modifications may be made. Accordingly, other embodiments are within the scope of the following claims.

What is claimed is:

1. A method comprising:
   eletroplating tin from a solution comprising
      a bath-soluble tin compound,
      a methane-sulfonic acid, and
      a polyethyleneglycol alkyl-3-sulfopropyl diether,
   wherein the tin is electroplated with a current density of greater than approximately 30 mA/cm² and a plating efficiency of greater than approximately 95%.

2. The method of claim 1, wherein electroplating the tin further comprises electroplating the tin with the current density being greater than approximately 40 mA/cm².

3. The method of claim 2, wherein electroplating the tin further comprises electroplating the tin with the current density being greater than approximately 50 mA/cm².

4. The method of claim 1, wherein electroplating the tin further comprises electroplating the tin from the solution, wherein:
   the bath-soluble tin compound comprises one or more stannous alkane sulfonates of a formula $(RSO_3)_2Sn$, where R is an alkyl group that includes from one to twelve carbon atoms.

5. The method of claim 4, wherein electroplating the tin further comprises electroplating the tin from the solution, wherein:
   the one or more stannous alkane sulfonates comprises between approximately 20 and 40 grams per liter of stannous methane sulfonate;
   the methanesulfonic acid comprises between approximately 100 and 200 grams per liter of methanesulfonic acid; and
   the polyethyleneglycol alkyl-3-sulfopropyl diether comprises between approximately 1 and 2 grams of one or more polyethyleneglycol alkyl-3-sulfopropyl diethers per liter.

6. The method of claim 1, wherein electroplating the tin comprises electroplating tin onto a semiconductor device.

7. The method of claim 6, wherein electroplating tin onto the semiconductor device comprises electroplating tin bumps to connect a semiconductor die to packaging.

8. The method of claim 1, wherein electroplating the tin comprises forming a tin deposit that is greater than 99% tin.

9. The method of claim 1, wherein the solution further comprises between approximately 10 and 30 ppm benzalacetone.

10. A method comprising:
    electroplating tin from a bath including
       between approximately 20 and 40 grams per liter of one of stannous methane sulfonate, stannous sulfate, and a mixture thereof,
       between approximately 100 and 200 grams per liter of one of methanesulfonic acid, sulfuric acid, and a mixture thereof, and
       between approximately 1 and 2 grams per liter of one or more polyethyleneglycol alkyl3-sulfopropyl diethers.

11. The method of claim 10, wherein electroplating tin from the bath comprises electroplating tin from the bath, wherein the bath further includes between approximately 10 and 30 ppm benzalacetone.

12. The method of claim 10, wherein electroplating tin from the bath comprises electroplating tin from the bath, wherein the bath includes between approximately 130 and 170 grams per liter of one of the methanesulfonic acid, sulfuric acid, and the mixture thereof.

* * * * *